US012782578B2

(12) United States Patent
Chen

(10) Patent No.: US 12,782,578 B2
(45) Date of Patent: Nov. 3, 2026

(54) OPTICAL SENSING APPARATUS

(71) Applicant: Artilux, Inc., Menlo Park, CA (US)

(72) Inventor: Peng-Sheng Chen, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 593 days.

(21) Appl. No.: 18/491,337

(22) Filed: Oct. 20, 2023

(65) Prior Publication Data

US 2024/0210564 A1 Jun. 27, 2024

Related U.S. Application Data

(60) Provisional application No. 63/477,223, filed on Dec. 27, 2022.

(51) Int. Cl.

| | |
|---|---|
| ***G01S 17/894*** | (2020.01) |
| ***G01S 7/481*** | (2006.01) |
| ***H04N 25/60*** | (2023.01) |
| ***H04N 25/76*** | (2023.01) |
| ***H04N 25/77*** | (2023.01) |
| ***H10F 39/15*** | (2025.01) |

(52) U.S. Cl.
CPC .......... *G01S 17/894* (2020.01); *G01S 7/4816* (2013.01); *H04N 25/60* (2023.01); *H04N 25/77* (2023.01); *H04N 25/7795* (2023.01); *H10F 39/1538* (2025.01)

(58) Field of Classification Search
CPC ..... G01S 17/894; G01S 7/4816; H04N 25/60; H04N 25/77; H04N 25/7795; H10F 39/1538
USPC ........................................................ 250/214 R
See application file for complete search history.

(56) References Cited

U.S. PATENT DOCUMENTS

2006/0165294 A1* 7/2006 Mizuno ..................... G01J 1/44
257/E25.032
2017/0256666 A1* 9/2017 Webster ............... H04N 25/131

* cited by examiner

*Primary Examiner* — Thanh Luu
*Assistant Examiner* — Mai Thi Ngoc Tran
(74) *Attorney, Agent, or Firm* — Dority & Manning, P.A.

(57) ABSTRACT

Apparatuses for optical and image sensing are disclosed herein. The optical sensing apparatus can include a first and a second signal wire. The optical sensing apparatus can include N photodetectors arranged in an array, connected to the first signal wire and a second input terminal connected to the second signal wire. The optical sensing apparatus can include a modulation circuit configured to generate a modulated signal including a source transistor pair, a sink transistor pair, and a second sink transistor wherein a first photodetector of the N photodetectors is arranged between the source transistor pair and an Nth photodetector of the N photodetectors, and the Nth photodetector of the N photodetectors is arranged between the sink transistor pair and the first photodetector of the N photodetectors.

20 Claims, 5 Drawing Sheets

OPTICAL SENSING APPARATUS

CROSS-REFERENCE TO RELATED APPLICATIONS

This patent application claims priority to U.S. Provisional Patent Application No. 63/477,223 filed Dec. 27, 2022, the contents of which are hereby incorporated herein by reference in their entirety.

FIELD

The present application is related to an optical and image sensing apparatus.

BACKGROUND

Optical sensors are being used in many systems, such as smartphones, wearable electronics, robotics, and autonomous vehicles, etc. for proximity detection, 2D/3D imaging, object recognition, image enhancement, material recognition, color fusion, health monitoring, and other relevant applications.

SUMMARY OF THE INVENTION

The present disclosure discloses an optical sensing apparatus having a configurable/reconfigurable pixel array that can be used for time-of-flight (ToF) sensor. The optical sensing apparatus can be operable for different wavelength ranges, including visible (e.g., wavelength range 380 nm to 780 nm, or a similar wavelength range as defined by a particular application) and non-visible light. The non-visible light includes near-infrared (NIR, e.g., wavelength range from 780 nm to 1000 nm, or a similar wavelength range as defined by a particular application) and short-wavelength infrared (SWIR, e.g., wavelength range from 1000 nm to 3000 nm, or a similar wavelength range as defined by a particular application) light.

One aspect of the present disclosure is directed to an optical sensing apparatus. The optical sensing apparatus includes a first signal wire. The optical sensing apparatus includes a second signal wire. The optical sensing apparatus includes N photodetectors arranged in an array, each photodetector including a first input terminal connected to the first signal wire and a second input terminal connected to the second signal wire, wherein N is a positive integer greater than one. The optical sensing apparatus includes a modulation circuit configured to generate a modulated signal. The modulation circuit is configured to generate a modulated signal and includes a source transistor pair. The source transistor pair includes a first source transistor including a first terminal connected to a first voltage source, a second terminal connected to a first end of the first signal wire, and a third terminal connected to a first driver signal. The source transistor pair includes a second source transistor including a first terminal connected to the first voltage source, a second terminal connected to a first end of the second signal wire, and a third terminal connected to a second driver signal. The modulation circuit is configured to generate a modulated signal and includes a sink transistor pair. The sink transistor pair includes a first sink transistor including a first terminal connected to a second voltage source, a second terminal connected to a second end of the first signal wire, and a third terminal connected to the second driver signal. The sink transistor pair includes a second sink transistor including a first terminal connected to the second voltage source, a second terminal connected to a second end of the second signal wire, and a third terminal connected to the first driver signal, wherein a first photodetector of the N photodetectors is arranged between the source transistor pair and an Nth photodetector of the N photodetectors, and wherein the Nth photodetector of the N photodetectors is arranged between the sink transistor pair and the first photodetector of the N photodetectors.

In some embodiments, a voltage of the first voltage source is higher than that of the second voltage source.

In some embodiments, each of the source transistor pair is a source logic circuit, and each of the sink transistor pair is a sink logic circuit.

In some embodiments, each of the source transistor pair includes a PMOS transistor.

In some embodiments, each of the sink transistor pair includes an NMOS transistor.

In some embodiments, optical sensing apparatus includes a first control clock signal coupled to the third terminal of the first source transistor, and a second control clock signal coupled to the third terminal of the second source transistor, wherein the first control clock signal and the second control clock signal have opposite polarities.

In some embodiments, the first control clock signal is coupled to the third terminal of the second sink transistor, and the second control clock signal is coupled to the third terminal of the first sink transistor.

In some embodiments, the optical sensing apparatus includes a two-dimensional pixel array, and the N photodetectors are arranged in a row or a column of the two-dimensional pixel array.

In some embodiments, each photodetector includes an output terminal in response to receiving an optical signal, to output a detecting signal according to the modulated signal.

In some embodiments, each photodetector includes an absorption region embedded in a substrate, and wherein the absorption region and the substrate have different material.

In some embodiments, the absorption region includes germanium, and the substrate includes silicon.

In some embodiments, each photodetector includes a first modulation region embedded in the absorption region and electrically connected to the respective first input terminal, and a second modulation region embedded in the absorption region and electrically connected to the respective second input terminal.

In some embodiments, each photodetector includes a first modulation region embedded in the substrate and electrically connected to the respective first input terminal, and a second modulation region embedded in the substrate and electrically connected to the respective second input terminal.

In some embodiments, each photodetector includes a collection region embedded in the absorption region, and an output terminal electrically connected to the collection region.

In some embodiments, each photodetector includes a collection region embedded in the substrate, a first modulation region embedded in the absorption region, and a second modulation region embedded in the absorption region.

Another aspect of the present disclosure is directed to an image sensing apparatus. The image sensing apparatus includes a first signal wire. The image sensing apparatus includes a second signal wire. The image sensing apparatus includes N photodetectors arranged in an array, each photodetector including a first input terminal connected to the first signal wire and a second input terminal connected to the second signal wire, wherein N is a positive integer greater than one. The image sensing apparatus includes a modulation circuit configured to generate a modulated signal. The modulation circuit is configured to generate a modulated signal and includes a source transistor pair. The source transistor pair includes a first source transistor including a first terminal connected to a first voltage source, a second terminal connected to a first end of the first signal wire, and a third terminal connected to a first driver signal. The source transistor pair includes a second source transistor including a first terminal connected to the first voltage source, a second terminal connected to a first end of the second signal wire, and a third terminal connected to a second driver signal. The modulation circuit is configured to generate a modulated signal and includes a sink transistor pair. The sink transistor pair includes a first sink transistor including a first terminal connected to a second voltage source, a second terminal connected to a second end of the first signal wire, and a third terminal connected to the second driver signal. The sink transistor pair includes a second sink transistor including a first terminal connected to the second voltage source, a second terminal connected to a second end of the second signal wire, and a third terminal connected to the first driver signal, wherein a first photodetector of the N photodetectors is arranged between the source transistor pair and an Nth photodetector of the N photodetectors, and wherein the Nth photodetector of the N photodetectors is arranged between the sink transistor pair and the first photodetector of the N photodetectors.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings.

DETAILED DESCRIPTION

Figure 1:
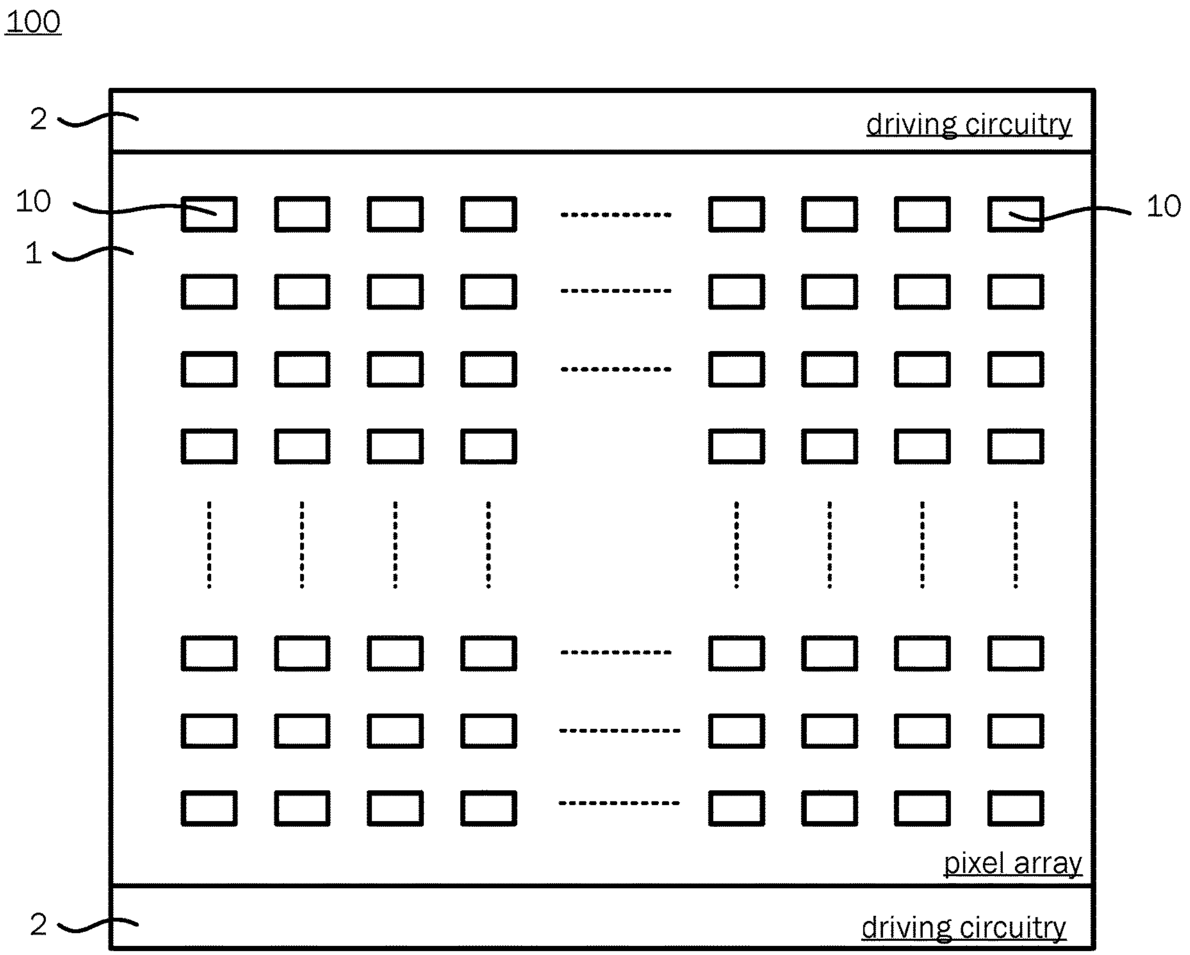
FIG. 1 illustrates an optical sensing apparatus in accordance with one embodiment of the present disclosure.

The following embodiments accompany the drawings to illustrate the concept of the present disclosure. In the drawings or descriptions, similar or identical parts use the same reference numerals, and in the drawings, the shape, thickness or height of the element is can be reasonably expanded or reduced. The embodiments listed in the present application are only used to illustrate the present application and are not used to limit the scope of the present application. Any obvious modification or change made to the present application does not depart from the spirit and scope of the present application.

In a time-of-flight (ToF) sensor, photodetectors can collectively form as an 1-D or 2D pixel array to detect the time of arrival of the reflected light to determine the distance between the ToF sensor and the target object. Typically, a row or a column of photodetectors of the pixel array is electrically connected to (or electrically coupled to) and controlled by a common modulated signal generated by a modulation circuit through a signal wire, and outputs a plurality of detecting signals to present the distance information. Since the signal wire has parasitic resistance, the modulated signal transmitted on the signal wire for controlling the plurality of photodetectors belonging to the same row or column will attenuate with the increase in the transmission distance. The distortion of the modulated signal applied on the photodetector farther from the modulation circuit is greater than the distortion of the modulated signal applied on the photodetector closer to the modulation circuit. When a ToF sensor needs high-resolution pixel array, a row or a column of photodetectors includes a large number of photodetectors (e.g., 240, 480, 640, or any other suitable number) connected to the modulation circuit through the signal wire. In this case, the modulated signal applied on a portion of photodetectors far away from the modulation circuit can be severely distorted. The quality of the detecting signals detected by the plurality of photodetectors belonging to the same row or column are affected by the noise due to the distortion, and the measured distance information provided by the ToF sensor may be incorrect. Accordingly, a driving circuitry that reduces or eliminates such distortion would be desirable.

FIG. 1 illustrates an optical sensing apparatus 100 in accordance with one embodiment of the present disclosure. The optical sensing apparatus 100 can be a ToF sensor and includes a pixel array 1, and a plurality of driving circuitries 2 coupled to the pixel array 1 (e.g., on a monolithically integrated IC, on a separate IC coupled to the pixel array 1 through wire-bond, flip-chip bond, hybrid-bond, or other suitable implementations). The pixel array 1 includes a plurality of photodetector 10 arranged in a two-dimensional array having a plurality of rows and columns of photodetectors. The driving circuitries 2 includes a modulation circuit, a power circuit, etc. The modulation circuit is configured to provide the modulated signal to one or more photodetectors to generate the detecting signal in response to receiving the optical signal. The power circuit is configured to enable or disable one or more of the plurality of photodetectors.

Figure 2A:
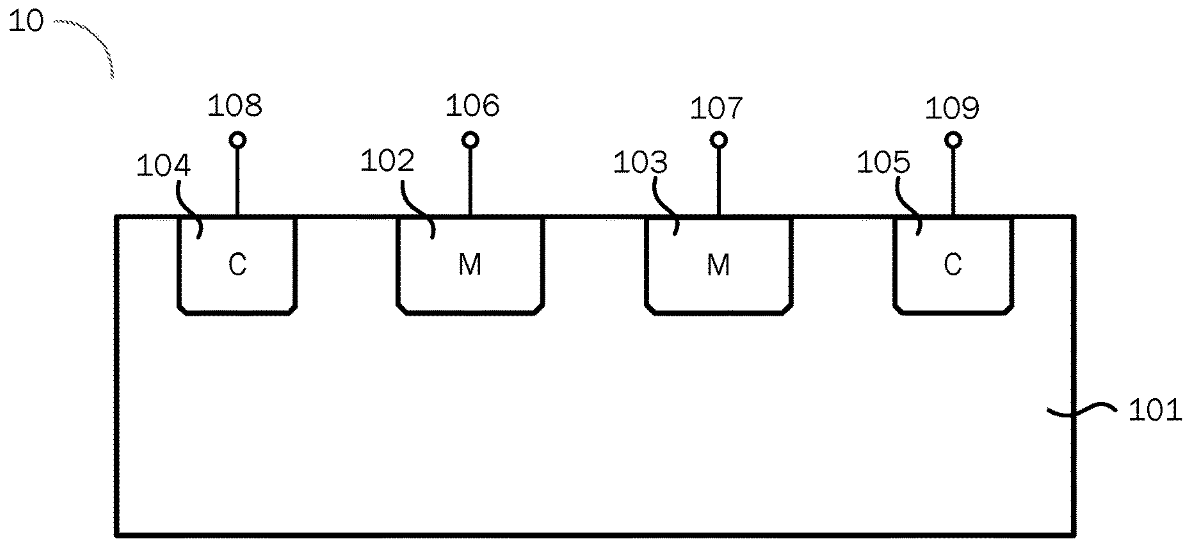
FIG. 2A illustrates a photodetector in accordance with one embodiment of the present disclosure.

FIG. 2A illustrates a photodetector 10 in accordance with one embodiment of the present disclosure. The symbol "C" represents a collection region and "M" represents a modulation region. The photodetector 10 can be a two-switch photodetector for indirect ToF (i-ToF) sensor. The photodetector 10 includes a substrate 101, the first modulation region 102, the second modulation region 103, the first collection region 104, and the second collection region 105. The substrate 101 includes light-absorption material for receiving the optical signal and generating charge carriers (e.g., electrons and holes) in response to receiving the optical signal. In an embodiment, the substrate 101 can be a silicon substrate and the light-absorption material can include silicon. In another embodiment, the light-absorption material includes III-V semiconductor materials. In another embodiment, the light-absorption material includes germanium (Ge), or silicon-germanium (SiGe). The first collection region 104 and the second collection region 105 are embedded in the substrate 101, and are configured to collect a portion of the charged carriers for output. The first modulation region 102 and the second modulation region 103 are embedded in the substrate 101, and are configured to control a flow of charge carrier from the substrate 101 to the first collection region 104 or the second collection region 105. The first input terminal 106 and the second input terminal 107 are coupled to the first modulation region 102 and the second modulation region 103, and are configured to transmit the modulated signal to the first modulation region 102 and the second modulation region 103 respectively. As an example, the first input terminal 106 can be connected to a modulated signal that is 0-degree phase-shifted, and the second input terminal 107 can be connected to the same modulated signal that is 180-degree phase-shifted. The first output terminal 108 and the second output terminal 109 are coupled to the first collection region 104 and the second collection region 105, are configured to output the detecting signals, in response to the photo-generated charge carrier, from the first collection region 104 and the second collection region 105 respectively. The first modulation region 102 and the second modulation region 103 can be doped or un-doped. In an embodiment, the first modulation region 102 and the second modulation region 103 can be doped with N-type or P-type dopants. The first collection region 104 and the second collection region 105 can be doped.

Figure 2B:
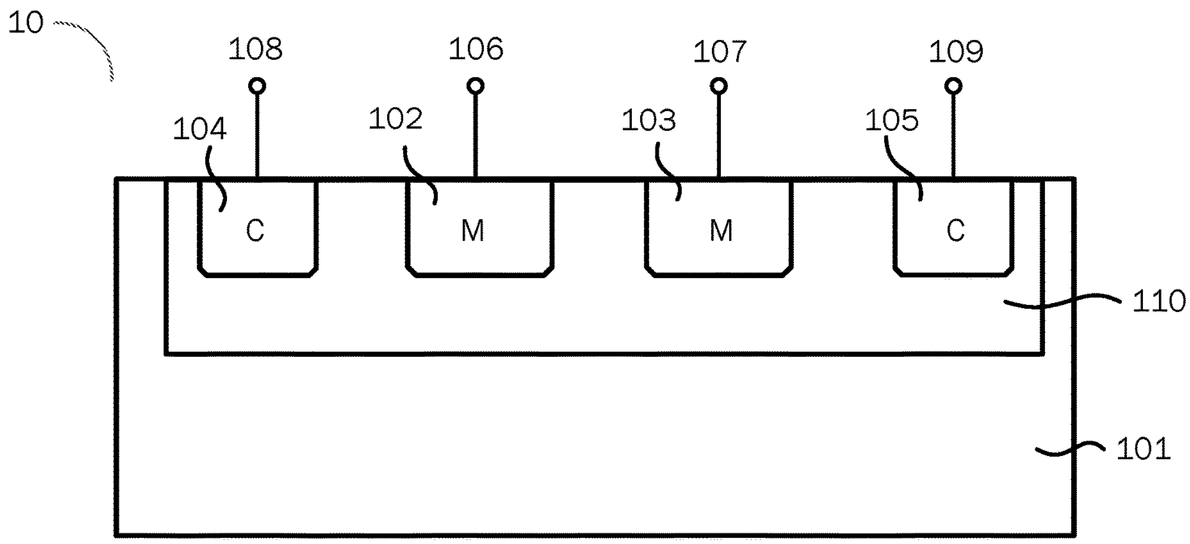
FIG. 2B illustrates a photodetector in accordance with another embodiment of the present disclosure.

FIG. 2B illustrates a photodetector 10 in accordance with another embodiment of the present disclosure. The photodetector 10 has a light-absorption region 110 embedded in the substrate 101, and the material of the light-absorption region 110 is different from that of the substrate 101. In an embodiment, the substrate 101 is silicon substrate and the light-absorption region 110 includes germanium material. In another embodiment, the substrate 101 is silicon substrate and the light-absorption region 110 includes III-V semiconductor materials. The first modulation region 102, the second modulation region 103, the first collection region 104, and the second collection region 105 are formed in the light-absorption region 110. The first modulation region 102 and the second modulation region 103 can be doped or un-doped. In an embodiment, the first modulation region 102 and the second modulation region 103 can be doped with N-type or P-type dopants. The first collection region 104 and the second collection region 105 can be doped. The operation at the input terminals 106, 107 and the output terminals 108, 109 can refer to the aforementioned embodiments.

Figure 2C:
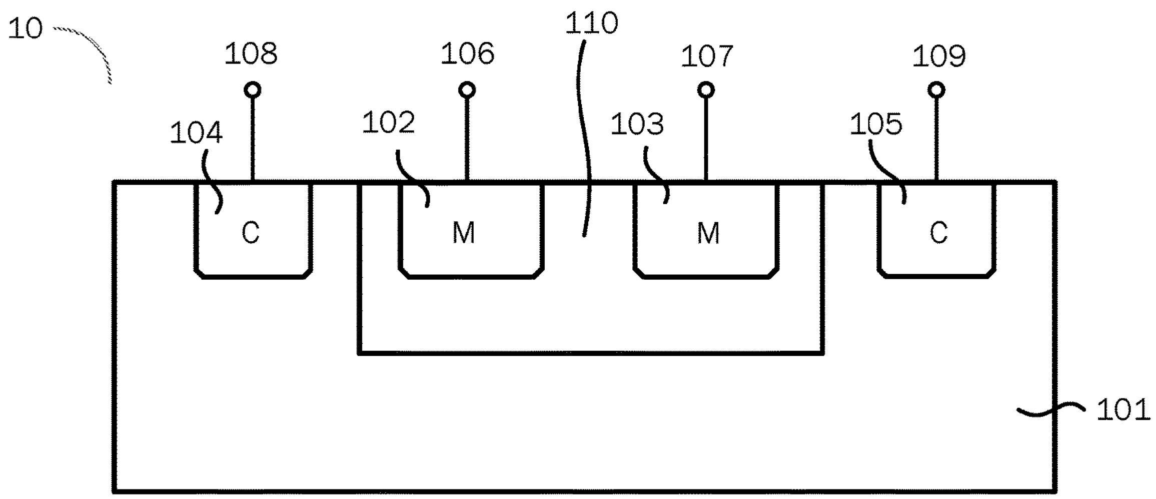
FIG. 2C illustrates a photodetector in accordance with another embodiment of the present disclosure.
Figure 2D:
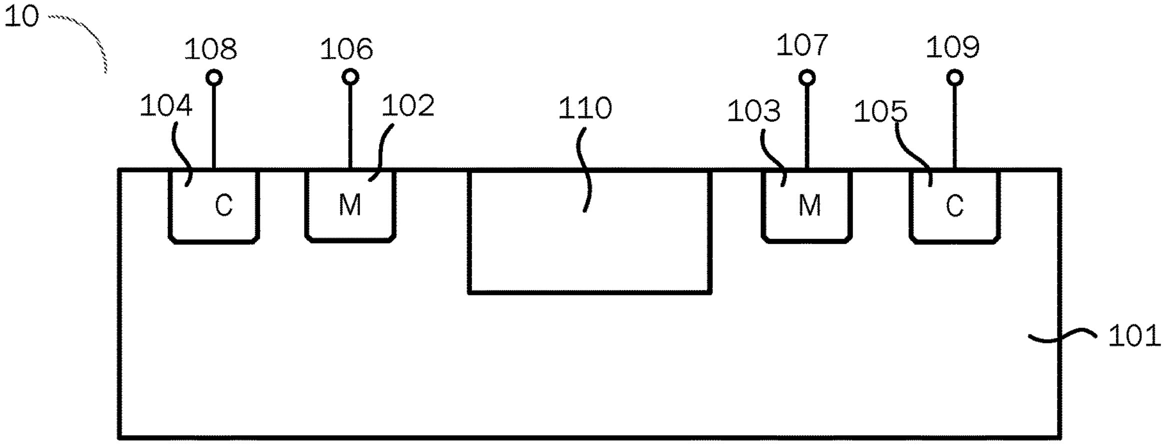
FIG. 2D illustrates a photodetector in accordance with another embodiment of the present disclosure.

FIG. 2C illustrates a photodetector 10 in accordance with another embodiment of the present disclosure. The first collection region 104 and the second collection region 105 can be formed in the substrate 101, and the first modulation region 102 and the second modulation region 103 are formed in the light-absorption region 110. FIG. 2D illustrates a photodetector 10 in accordance with another embodiment of the present disclosure. The photodetector 10 has a light-absorption region 110 embedded in the substrate 101, and the material of the light-absorption region 110 is different from that of the substrate 101. In an embodiment, the substrate 101 is silicon substrate and the light-absorption region 110 includes germanium material. The first collection region 104 and the second collection region 105 can be formed in the substrate 101, and the first modulation region 102 and the second modulation region 103 can be formed in the substrate 101.

Figure 3:
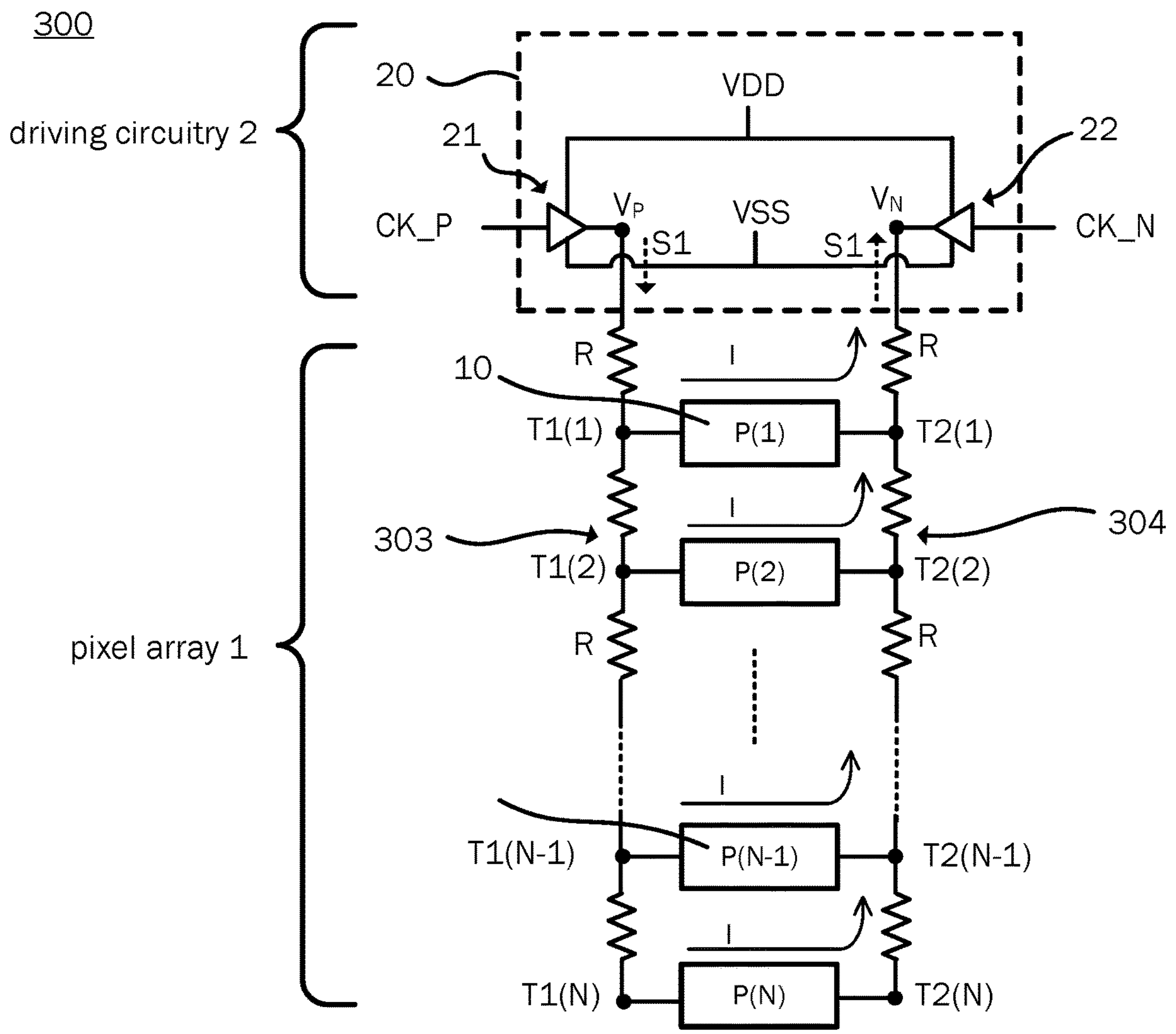
FIG. 3 illustrates an architecture of modulation circuit of an enlarge view of the optical sensing apparatus 100 in accordance with one embodiment of the present disclosure.

FIG. 3 illustrates a conventional system of modulation circuit. The system 300 includes one column of N photodetectors 10 of the pixel array 1, and a portion of the driving circuitry 2. Each photodetector 10 has two input terminals T1 and T2 coupled to the modulation region for receiving the modulated signal S1. The driving circuitry 2 includes a modulation circuit 20 for generating modulated signals S1. Each first input terminal T1 of the photodetector 10 connects to the first signal wire 303, and each second input terminal T2 of the photodetector 10 connects to the second signal wire 304. One end of the first signal wire 303 connects to the modulation circuit 20 to transmit the modulated signal S1 and another end of the first signal wire 303 connects to the $N^{th}$ photodetector P(N). One end of the second signal wire 304 connects to the modulation circuit 20 to transmit the modulated signals S1 and another end of the second signal wire 304 connects to the $N^{th}$ photodetector P(N). As an example, the modulation circuit 20 includes a first buffer 21 and a second buffer 22 coupled to the first voltage source VDD and the second voltage source VSS operating under a voltage range between the first voltage source VDD and the second voltage source VSS. The buffers 21, 22 can be implemented by CMOS inverters. In addition, the MOS transistor used in the buffers 21, 22 may be triple-well MOS. For example, the triple-well MOS can be implemented by adding a deep N-well.

The modulated signals S1 can be clock signals with a predetermined duty cycle (e.g., 50% or less than 50%) and can also be sinusoidal signals. For example, the driver signals CK_P and CK_N coupled to the first buffer 21 and the second buffer 22 respectively to control the duty cycle of 50% or below 50%. The driver signals CK_P and CK_N have opposite polarities. During operations, the modulated signals S1 generated by the modulation circuit 20 flows through the first signal wire 303 and the second signal wire 304 to control each photodetectors P(1)~P(N). The current path I of the modulated signal flowing through each photodetector P is indicated by lines in FIG. 3. The first signal wire 303 has a plurality of parasitic resistance R, where each section of the first signal wire 303 located between adjacent two first input terminals T1 (e.g., T1(1) and T1(2)) can have a parasitic resistance R. The second signal wire 304 has a plurality of parasitic resistance R, where each section of the second signal wire 304 located between adjacent two second input terminals T2 (e.g., T2(1) and T2(2)) can have a parasitic resistance R. Therefore, the modulated signal S1 applied on each photodetectors P has different voltage offset or distortion relative to the modulated signal applied on photodetector P(1).

In one embodiment, the modulated signal V(1) applied on the photodetector P(1) can be derived from the voltage difference between the first input terminal T1(1) of the photodetector P(1) and the second input terminal T2(1) of the photodetector P(1), which is shown in Equation I below. The modulated signal V(N) applied on the photodetector P(N) can be derived from the voltage difference between the first input terminal T1(N) of the photodetector P(N) and the second input terminal T2(N) of the photodetector P(N), which is shown in Equation II. The maximum voltage offset or distortion $V_{Max\_offset}$ of the modulated signals can be derived from the difference between the modulated signals V(1) and V(N) which are applied on the photodetector P(1) and the photodetector P(N) respectively, which is shown in Equation III.

$$V[T1(1)] = VDD - I \times R \times N \quad \text{Equation II}$$

$$V[T2(1)] = VSS + I \times R \times N$$

$$V(1) = V[T1(1)] - V[T2(1)] = (VDD - VSS) - 2 \times I \times R \times N$$

$$V[T1(N)] = VDD - I \times R \times (1 + 2 + \ldots + N) = VDD - I \times R \times \frac{N(N+1)}{2} \quad \text{Equation II}$$

$$V[T2(N)] = VSS + I \times R \times (1 + 2 + \ldots + N) = VSS + I \times R \times \frac{N(N+1)}{2}$$

$$V(N) = V[T1(N)] - V[T2(N)] = (VDD - VSS) - 2 \times I \times R \times \frac{N(N+1)}{2}$$

$$V_{Max\_offset} = V(1) - V(N) = I \times R \times (N^2 - N) \quad \text{Equation III}$$

Depending on the value of the parasitic resistance and/or the number of photodetectors arranged in a row/column, the maximum of voltage offset between the first and the Nth photodetector may be too large, such that the modulated signal V(N) applied on the photodetector P(N) is smaller than a threshold voltage swing required to operate a photodetector. In such a case, a noise level for the photodetector P(N) may be too high for the photodetector P(N) to operate properly. To avoid such problem, multiple modulation circuits may be required to drive one row/column of photodetectors, which would lead to an increase of an overall footprint of the circuit.

Figure 4:
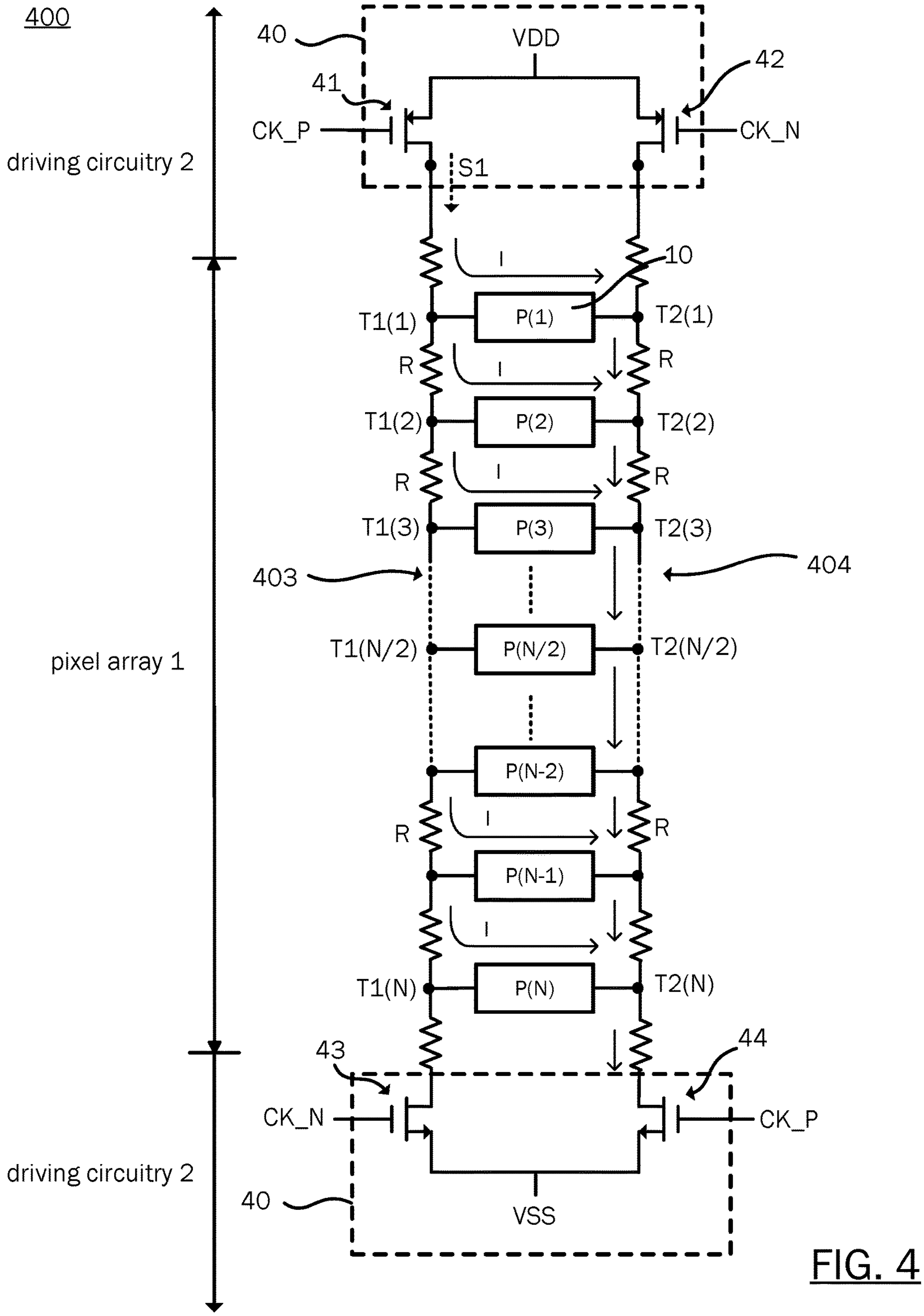
FIG. 4 illustrates an architecture of modulation circuit of an enlarge view of the optical sensing apparatus 100 in accordance with another embodiment of the present disclosure.

FIG. 4 illustrates a system of modulation circuit of the optical sensing apparatus 100 in accordance with an embodiment of the present disclosure. The system 400 includes one column of N photodetectors 10 of the pixel array 1, and a portion of the driving circuitry 2. One column of photodetectors 10 includes N photodetectors denoted as P(1)~P(N) and is controlled by the modulation circuit 40. The modulation circuit 40 includes a pair of the first-type transistor 41, 42 and a pair of the second-type transistor 43, 44. The first first-type transistor 41 includes a first terminal connected to the first voltage source VDD, a second terminal connected to a first end of the first signal wire 403, and a third terminal connected to the first driver signal CK_P. The second first-type transistor 42 includes a first terminal connected to the first voltage source VDD, a second terminal connected to a first end of the second signal wire 404, and a third terminal connected to the second driver signal CK_N. The first second-type transistor 43 includes a first terminal connected to the second voltage source VSS, a second terminal connected to a second end of the first signal wire 403, and a third terminal connected to the second driver signal CK_N. The second second-type transistor 44 includes a first terminal connected to the second voltage source VSS, a second terminal connected to a second end of the second signal wire 404, and a third terminal connected to the first driver signal CK_P. The first-type transistors 41, 42 may be a source logic circuit such as source transistor pair (e.g., PMOS, etc.) connecting to the first voltage source VDD for transmitting the current from the first voltage source VDD. The second-type transistors 43, 44 may be a sink logic circuit such as sink transistor pair (e.g., NMOS, etc.) connecting to the second voltage source VSS for sinking the current to the second voltage source VSS. The voltage of the first voltage source VDD is higher than that of the second voltage source VSS. Each photodetector 10 has two input terminals T1, T2 coupled to the modulation region for receiving the modulated signal S1. Each first input terminal T1 of the photodetector 10 is connected to the first signal wire 403, and each second input terminal T2 is connected to the second signal wire 404. One end of the first signal wire 403 closer to the photodetector P(1) connects to the first first-type transistor 41 and another end of the first signal wire 403 closer to the photodetector P(Y) connects to the first second-type transistor 43. One end of the second signal wire 404 closer to the photodetector P(1) connects to the second first-type transistor 42 and another end of the second signal wire 404 closer to the photodetector P(Y) connects to the second second-type transistor 44. The photodetector P(1) is arranged between the pair of the first-type transistor 41, 42 and the photodetector P(Y). The photodetector P(Y) is arranged between the pair of the second-type transistor 43, 44 and the photodetector P(1). The modulation circuit 40 is operated under a voltage range between the first voltage source VDD and the second voltage source VSS.

The modulated signals S1 can be clock signals with a predetermined duty cycle (e.g., 50% or less than 50%) and can also be sinusoidal signals. The driver signals CK_P and CK_N coupled to the first-type transistor 41, 42 respectively, and coupled to the second-type transistor 43,44 respectively to control the duty cycle of be 50% or below 50%. The driver signals CK_P and CK_N have opposite polarities. During operations, the modulated signals S1 transmitted from the first-type transistor 41, 42 flows through the first signal wire 403 and the second signal wire 404 to control each photodetector 10. The current path I of the modulated signal flowing through each photodetector 10 is indicated by lines in FIG. 4. The first signal wire 403 has a plurality of parasitic resistors R, where each section of the first signal wire 403 located between adjacent two first input terminals T1 (e.g., T1(1) and T1(2)) can have a parasitic resistor R. The second signal wire 404 has a plurality of parasitic resistors R, where each section of the second signal wire 403 located between adjacent two second input terminals T2 (e.g., T2(1) and T2(2)) can have a parasitic resistor R. Therefore, the modulated signal S1 applied on each photodetectors P has different voltage offset or distortion relative to the modulated signal applied on photodetector P(1).

In one embodiment, the modulated signal V(1) applied on the photodetector P(1) can be derived from the voltage difference between the first input terminal T1(1) and the second input terminal T2(1) of the photodetector P(1), which is shown in Equation IV below. The modulated signal V(N) applied on the photodetector P(N) can be derived from the voltage difference between the first input terminal T1(N) and the second input terminal T2(N) of the photodetector P(N), which is shown in Equation V. As shown in Equation IV and Equation V, the modulated signal V(N) applied on the photodetector P(N) is same as the modulated signal V(1) applied on the photodetector P(1). The maximum of voltage offset or distortion $V_{Max\_offset}$ of the modulated signals is appeared on photodetector P(N/2) and can be calculated in Equation VI.

$$V[T1(1)] = VDD - I \times R \times N \quad \text{Equation IV}$$

$$V[T2(1)] = VSS + I \times R \times (1 + 2 + \ldots + N) = VSS + I \times R \times \frac{N(N+1)}{2}$$

$$V(1) = V[T1(1)] - V[T2(1)] = (VDD - VSS) - I \times R \times \frac{N^2 + 3N}{2}$$

$$V[T1(N)] = VDD - I \times R \times (1 + 2 + \ldots + N) = VDD - I \times R \times \frac{N(N+1)}{2} \quad \text{Equation V}$$

-continued $$V[T2(N)] = VSS + I \times R \times N$$

$$V(N) = V[T1(N)] - V[T2(N)] = (VDD - VSS) - I \times R \times \frac{N^2 + 3N}{2}$$

Equation VI $$V\left[T1\left(\frac{N}{2}\right)\right] = VDD - I \times R \times \left[\left(\frac{N}{2} + \left(\frac{N}{2} + 1\right) + \ldots + N\right)\right] = VDD - I \times R \times \left[\left(\frac{N(N+1)}{2} - \frac{\frac{N}{2}\left(\frac{N}{2} - 1\right)}{2}\right)\right]$$

$$V\left[T2\left(\frac{N}{2}\right)\right] = VSS + I \times R \times \left[\left(\left(\frac{N}{2} + 1\right) + \left(\frac{N}{2} + 2\right) + \ldots + N\right)\right] = VSS + I \times R \times \left[\left(\frac{N(N+1)}{2} - \frac{\frac{N}{2}\left(\frac{N}{2} + 1\right)}{2}\right)\right]$$

$$V\left(\frac{N}{2}\right) = V\left[T1\left(\frac{N}{2}\right)\right] - V\left[T2\left(\frac{N}{2}\right)\right] = (VDD - VSS) - I \times R \times \left(\frac{3N^2 + 4N}{4}\right)$$

$$V_{Max\_offset} = V(1) - V\left(\frac{N}{2}\right) = I \times R \times \frac{N^2 - 2N}{4}$$

As shown in Equations III and VI, the maximum of voltage offset $V_{Max\_offset}$ of the modulated signal in system 400 is smaller that in system 300. Accordingly, the circuit area of the modulation circuit 40 can be smaller than that of the modulation circuits 20. Therefore, the size of the optical sensing apparatus including the modulation circuit shown in system 400 can be reduced and suitable for applications in space-limited devices. One advantage provided by the system 400 is that the modulation circuit not only decrease the distortion of the modulated signal, but also decrease the complexity and the size of the circuit design.

This present application shows a plurality of photodetectors 10 belonging to the same column are connected to a modulated circuit and controlled by a common modulated signal, but the present application is not limited thereto. That is, a plurality of photodetectors 10 belonging to a specific arrangement can be connected to a modulated circuit and controlled by a common modulated signal. For example, a plurality of photodetectors 10 belonging to the same row are connected to a modulated circuit and controlled by a common modulated signal.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded to the broadest interpretation so as to encompass all such modifications and similar arrangements and procedures.

What is claimed is:

1. An optical sensing apparatus, comprising:

a first signal wire;

a second signal wire;

N photodetectors arranged in an array, each photodetector comprising a first input terminal connected to the first signal wire and a second input terminal connected to the second signal wire, wherein Nis a positive integer greater than one;

a modulation circuit configured to generate a modulated signal and comprising:

a source transistor pair comprising:

a first source transistor comprising a first terminal connected to a first voltage source; a second terminal connected to a first end of the first signal wire; and a third terminal connected to a first driver signal; and a second source transistor comprising a first terminal connected to the first voltage source; a second terminal connected to a first end of the second signal wire; and a third terminal connected to a second driver signal; and a sink transistor pair comprising:

a first sink transistor comprising a first terminal connected to a second voltage source; a second terminal connected to a second end of the first signal wire; and a third terminal connected to the second driver signal; and a second sink transistor comprising a first terminal connected to the second voltage source; a second terminal connected to a second end of the second signal wire; and a third terminal connected to the first driver signal, wherein a first photodetector of the N photodetectors is arranged between the source transistor pair and an Nth photodetector of the N photodetectors, and wherein the Nth photodetector of the N photodetectors is arranged between the sink transistor pair and the first photodetector of the N photodetectors.

2. The optical sensing apparatus of claim 1, wherein a voltage of the first voltage source is higher than that of the second voltage source.

3. The optical sensing apparatus of claim 1, wherein each of the source transistor pair is a source logic circuit, and wherein each of the sink transistor pair is a sink logic circuit.

4. The optical sensing apparatus of claim 1, wherein each of the source transistor pair comprises a PMOS transistor.

5. The optical sensing apparatus of claim 1, wherein each of the sink transistor pair comprises an NMOS transistor.

6. The optical sensing apparatus of claim 1, further comprising a first control clock signal coupled to the third terminal of the first source transistor, and a second control clock signal coupled to the third terminal of the second source transistor, and wherein the first control clock signal and the second control clock signal have opposite polarities.

7. The optical sensing apparatus of claim 6, wherein the first control clock signal is coupled to the third terminal of the second sink transistor, and the second control clock signal is coupled to the third terminal of the first sink transistor.

8. The optical sensing apparatus of claim 1, wherein the optical sensing apparatus comprises a two-dimensional pixel array, and the N photodetectors are arranged in a row or a column of the two-dimensional pixel array.

9. The optical sensing apparatus of claim 1, wherein each photodetector comprises an output terminal in response to receiving an optical signal, to output a detecting signal according to the modulated signal.

10. The optical sensing apparatus of claim 1, wherein each photodetector comprises an absorption region embedded in a substrate, and wherein the absorption region and the substrate have different materials.

11. The optical sensing apparatus of claim 10, wherein the absorption region comprises germanium, and the substrate comprises silicon.

12. The optical sensing apparatus of claim 10, wherein each photodetector comprises a first modulation region embedded in the absorption region and electrically connected to the respective first input terminal, and a second modulation region embedded in the absorption region and electrically connected to the respective second input terminal.

13. The optical sensing apparatus of claim 10, wherein each photodetector comprises a first modulation region embedded in the substrate and electrically connected to the respective first input terminal, and a second modulation region embedded in the substrate and electrically connected to the respective second input terminal.

14. The optical sensing apparatus of claim 10, wherein each photodetector comprises a collection region embedded in the absorption region, and an output terminal electrically connected to the collection region.

15. The optical sensing apparatus of claim 10, wherein each photodetector comprises a collection region embedded in the substrate, a first modulation region embedded in the absorption region, and a second modulation region embedded in the absorption region.

16. An image sensing apparatus, comprising:

a first signal wire;

a second signal wire;

N photodetectors arranged in an array, each photodetector comprising a first input terminal connected to the first signal wire and a second input terminal connected to the second signal wire, wherein N is a positive integer greater than one;

a modulation circuit configured to generate a modulated signal and comprising:

a source transistor pair comprising:

a first source transistor comprising a first terminal connected to a first voltage source; a second terminal connected to a first end of the first signal wire; and a third terminal connected to a first driver signal; and a second source transistor comprising a first terminal connected to the first voltage source; a second terminal connected to a first end of the second signal wire; and a third terminal connected to a second driver signal; and a sink transistor pair comprising:

a first sink transistor comprising a first terminal connected to a second voltage source; a second terminal connected to a second end of the first signal wire; and a third terminal connected to the second driver signal; and a second sink transistor comprising a first terminal connected to the second voltage source; a second terminal connected to a second end of the second signal wire; and a third terminal connected to the first driver signal, wherein a first photodetector of the N photodetectors is arranged between the source transistor pair and an Nth photodetector of the N photodetectors, and wherein the Nth photodetector of the N photodetectors is arranged between the sink transistor pair and the first photodetector of the N photodetectors.

17. The image sensing apparatus of claim 16, wherein a voltage of the first voltage source is higher than that of the second voltage source.

18. The image sensing apparatus of claim 16, wherein each of the source transistor pair is a source logic circuit, and wherein each of the sink transistor pair is a sink logic circuit.

19. The image sensing apparatus of claim 16, wherein each of the source transistor pair comprises a PMOS transistor.

20. The image sensing apparatus of claim 16, wherein each of the sink transistor pair comprises an NMOS transistor.

* * * * *